United States Patent [19]

Glasl et al.

[11] 4,029,527

[45] June 14, 1977

[54] METHOD OF PRODUCING A DOPED ZONE OF A GIVEN CONDUCTIVITY TYPE IN A SEMICONDUCTOR BODY

[75] Inventors: Andreas Glasl, Haar; Helmuth Murrmann, Ottobrunn, both of Germany

[73] Assignee: Siemens Aktiengesellschaft, Berlin & Munich, Germany

[22] Filed: June 18, 1975

[21] Appl. No.: 587,966

[30] Foreign Application Priority Data

June 21, 1974 Germany .......................... 2429957

[52] U.S. Cl. .................................. 148/187; 148/175
[51] Int. Cl.² ........................................ H01L 21/223
[58] Field of Search ...................... 148/175, 187

[56] References Cited

UNITED STATES PATENTS

| | | | |
|---|---|---|---|
| 3,621,346 | 11/1971 | Chang et al. | 148/187 UX |
| 3,703,420 | 11/1972 | Vora | 148/187 X |
| 3,719,535 | 3/1973 | Zoroglu | 148/187 |
| 3,897,282 | 7/1975 | White | 148/175 |

Primary Examiner—L. Dewayne Rutledge
Assistant Examiner—J. M. Davis
Attorney, Agent, or Firm—Hill, Gross, Simpson, Van Santen, Steadman, Chiara & Simpson

[57] ABSTRACT

The "emitter-dip effect" is eliminated by applying a layer of an undoped polycrystalline semiconductor onto the surface of a select zone to be doped in a semiconductor body, for example, such as on the emitter zone of a silicon body and then diffusing a select dopant through the undoped polycrystalline semiconductor layer into the select zone of the semiconductor body.

1 Claim, 2 Drawing Figures

METHOD OF PRODUCING A DOPED ZONE OF A GIVEN CONDUCTIVITY TYPE IN A SEMICONDUCTOR BODY

BACKGROUND OF THE INVENTION

1. Field of the Invention

The invention relates to a method producing a doped zone of one conductivity type in a semiconductor body and somewhat more particularly to a method of producing such a zone which eliminates the "emitter-dip effect" within the semiconductor body.

2. Prior Art

In the design of high frequency transistors, it is desirable to maintain the maximum oscillation frequency as high as possible. This feature is generally equivalent to a high cut-off frequency at a low base resistance. Further, high frequency transistors generally require as thin a base zone as possible.

Canadian Pat. No. 878,173 (which corresponds to Austrian Pat. No. 313,981) suggests that high frequency transistors with suitable characteristics can be produced by continuing the emitter diffusion until the emitter diffusion front begins to advance or push the base diffusion front into the collector region which exists at the end of base diffusion region. In accordance with this prior art teaching, the base diffusion front is thus prevented from moving onward with increased emitter diffusion (the so-called "emitter-dip effect").

Such advancement of the base diffusion front may be explained, for example in situations where an emitter zone has an unusually high dopant (i.e. phosphorus) concentration in the surface region of a silicon semiconductor body, since such high dopant concentration causes lattice distortion, crystal faults phosphorus precipitation and the like to occur and expand in the region of the base zone lying beneath the emitter zone so as to cause an increased diffusion coefficient. This in turn causes the region of the base zone lying beneath the emitter zone to buckle out and during the necessary subsequent deepening of the emitter zone, to project out in relation to the emitter zone. The diffusion profile of the emitter zone must therefor be made deeper than would be necessary without the so-called "emitter-dip effect." As a result, an undesirable high inner base resistance occurs in the region below the emitter.

The heretofore noted Canadian patent does, in fact, provide some solution to the described problems. However, on the one hand, the emitter-dip effect is not avoided by following the teachings of this prior art since diffusion is only continued until the start of the emitter-dip effect and on the other hand, it is difficult with this process to determine or control the time at which the emitter-dip effect begins, particularly during mass production.

M. Takagi et al in "Supplement to the Journal of the Japan Society of Applied Physics," Vol. 42, 1973, pages 101–109, suggests a procedure for depositing a polycrystalline semiconductor layer highly doped with arsenic or phosphorus onto a semiconductor body whereby such doped polycrystalline layer acts as a diffusion source for the underlying body. This process, which allegedly is suitable for mass production and for production of high dopant concentrations at a surface of a semiconductor body, does not eliminate the "emitter-dip effect" so that the devices produced thereby will still exhibit the disadvantages associated with such emitter-dip effect.

SUMMARY OF THE INVENTION

The invention provides a method of producing a doped zone of a given conductivity type in a semiconductor body whereby the emitter-dip effect is avoided.

By practicing the principles of the invention, one may produce a doped zone of a given conductivity type by a diffusion process which does not cause any disturbance in the crystal lattice of the zone adjacent to the zone being doped.

In accordance with the principles of the invention, an undoped polycrystalline semiconductor layer is deposited onto a select surface or surface area of a semiconductor body and a dopant of a desired conductivity type is diffused through the polycrystalline layer into the semiconductor body below such layer so as to produce a zone of the desired conductivity type within the body.

Semiconductor components produced in accordance with the invention do not exhibit the emitter-dip effect. The invention is particularly suitable for the production of low noise npn-silicon transistors having high current amplification. Such transistors have a desirable very low inner base resistance. Short circuits between the emitter and the collector zones almost never occur with these transistors and they have a higher collector-emitter breakdown voltage.

DESCRIPTION OF THE PREFERRED EMBODIMENTS

Figure 1:
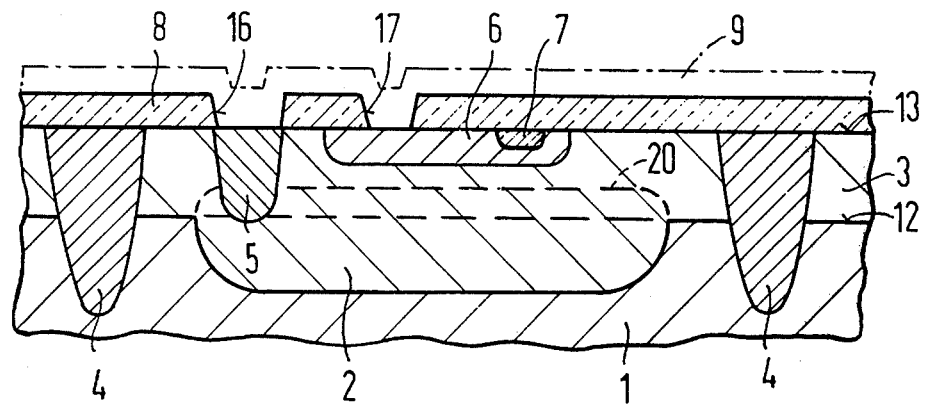
FIG. 1 is a partial cross-sectional view of a npn-transistor undergoing production in accordance with the principles of the invention.

The invention provides semiconductor components having no "emitter-dip effect," provides a semiconductor body having a polycrystalline semiconductor layer deposited thereon and provides a process for producing such semiconductor elements.

By following the principles of the invention, one may produce a doped zone of a given conductivity type in a semiconductor body by a diffusion process which does not cause remarkable disturbances or the like in a crystal lattice of the zones within the body adjacent to the area being doped.

Generally, the invention comprises depositing an undoped polycrystalline layer onto a select surface or surface area of a semiconductor body, providing a dopant of a given conductivity type for instance in a gaseous phase or in a doping layer and diffusing such dopant through the polycrystalline semiconductor layer into the select surface of the semiconductor body.

Referring now to the drawings wherein like reference numerals are utilized to designate like parts, a highly n-doped zone 2 is introduced into a surface 12 of a p-conductive semiconductor substrate 1 by conventional photo lacquer-etching techniques. Typically, the n-doped zone 2 has a specific resistance of 8 ohm.cm and functions as a buried layer which is doped with arsenic or antimony. A center portion of the surface 12 is at least partially shown by broken lines.

After the zone 2 has been produced, a n-conductive epitaxial layer 3 doped with, for example, arsenic, is deposited on surface 12 of substrate 1. The dopants diffuse into layer 3 from zone 2 as schematically indicated by broken line 20.

By using the usual silicon-planar technique, with the aid of further photo lacquer-etching processes, spaced-apart highly p-doped zones 4 and a highly n-doped zone 5 are introduced into the substrate 1 via the surface 13 of the epitaxial layer 3. The spaced-apart zones 4 form an insulating wall around the transistor which is being produced and together with the semiconductor substrate 1 define an insulated island. The zone 5 functions as the connection to the collector zone which overall comprises of the epitaxial layer 3 between the zones 4 and zones 2 and 5, respectively.

Thereafter, proceeding in a similar manner, a base zone 6 is introduced into the epitaxial layer 3 via the surface 13 thereof. Such base zone may be produced by diffusion or by ion implantation and in the exemplary embodiment herein described, is p-conductive. The base zone 6 is then provided with a highly p-doped base terminal zone 7, again by diffusion or ion implantation techniques. Typically, a silicon dioxide layer 8 is provided on the surface 13 of the epitaxial layer 3 at the end of these processing steps and windows 16 and 17 are etched into layer 8 by conventional photo lacquer-etching techniques. The window 16 provides access to zone 5 and the window 17 provides access to an area of the base zone 6 for producing an emitter zone thereat.

This stage of the production process of a npn-transistor is illustrated at FIG. 1.

Thereafter, an undoped polycrystalline semiconductor material, such as undoped polycrystalline silicon, is deposited in a layer thickness of about 0.3 μm onto the entire free surface of the arrangement shown at FIG. 1 so that a polycrystalline semiconductor layer 9 forms on the overall surface of the structure (the layer 9 is illustrated at FIG. 1 in broken line since portions thereof are removed after deposition). Typically, the polycrystalline silicon layer 9 is deposited from a suitable thermally decomposable gaseous silicon compound at a temperature of about 650° C and with a rate of 0.1 per/min. Thereafter, the emitter diffusion (for producing emitter zone 15) is then effected at about 900° C. through the polycrystalline layer 9, typically using $PH_3$ as a dopant.

Figure 2:
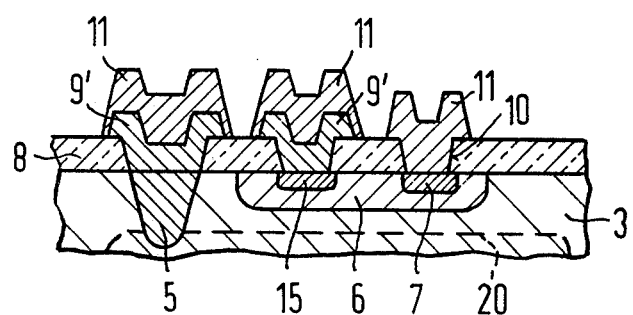
FIG. 2 is a somewhat similar view of a npn-transistor at another stage of the production process in accordance with the principles of the invention.

The polycrystalline semiconductor layer 9 is then etched away so that only the areas thereof which overlap the emitter and collector zone remain and only the polycrystalline semiconductor "residues" 9', such as shown at FIG. 2, are present on the resultant structure.

Next, a window 10 is etched into the silicon dioxide layer 8 to provide access to the base terminal zone 7 and metal contacts 11 are introduced in a conventional manner into window 10 and onto the polycrystalline semiconductor residues 9'. These residues 9' provide contact to the emitter zone 15 and the zone 5. The metal contacts 11 are typically composed of, for example, titanium and/or aluminum.

The phosphorus dopant used in producing the emitter zone 15 is diffused into the base zone 6 through the undoped polycrystalline semiconductor (typically silicon) layer 9. In this manner, the migration of phosphorus atoms is delayed by such polycrystalline semiconductor material and the phosphorus cannot produce any additional crystal defect or the like which would result in an increased diffusion coefficient of the boron dopant in base layer 6.

Accordingly, no "emitter-dip effect" occurs. The emitter dopant profile below the polycrystalline semiconductor layer 9 in the monocrystalline zone is very steep so that the emitter efficiency is correspondingly high.

In the base zone 6, which in accordance with the invention is less disturbed, a reduced recombination rate must be expected. The high emitter efficiency and the low recombination rate lead to a higher current amplification of the resultant transistor and the greater base width of such a transistor leads to an increase in the collector-emitter breakdown voltage which is desirable in many applications. The greater base width and the lack of the emitter-dip effect causes a small base resistance in the region of the base zone 6 located below the emitter zone 15, which prevents current crowding effects until currents of larger magnitudes than normal are encountered.

The following Table shows typical electrical characteristics of a transistor produced by prior art techniques and of a similar transistor produced in accordance with the principles of the invention.

TABLE I

| Electrical Characteristics | Prior Art Transistor | Exemplary Embodiment of Inventive Transistor |
|---|---|---|
| Base-layer resistance $R_s$ $[\Omega/\square]$ | 500 | 500 |
| Base width $x_j$ $[\mu m]$ | 0.8 | 0.8 |
| Current amplification B | 100 | 400 |
| Collector-emitter-breakdown voltage $U_{CEO}[V]$ | 7.9 | 12 |
| Emitter-base-breakdown voltage $U_{EBO}[V]$ | 6.5 | 5.8 |
| B-maximum at $1_C$ [mA] | 1 | 5 |
| Layer resistance of the base below the emitter $R_{s\,BB'}$ $[K\Omega/\square]$ | 8–10 | 0.7 |
| Cut-off frequency $f_t$ [GHz] | 1 | 0.7 |

As is apparent from the foregoing specification, the present invention is susceptible of being embodied with various alterations and modifications which may differ particularly from those that have been described in the preceding description. For this reason, it is to be fully understood that all of the foregoing is intended to be merely illustrative of the principles of the invention and is not to be construed or interpreted as being restrictive or otherwise limiting of the invention, excepting as is set forth and defined in the hereto-appended claims.

We claim as our invention:

1. In a process of producing a n-conductivity type doped zone in a silicon semiconductor body wherein a silicon polycrystalline semiconductor layer is deposited on the surface of the zone to be doped, the improvement comprising:
   depositing an undoped silicon polycrystalline semiconductor layer on the surface of the zone to be doped; and
   diffusing $PH_3$ through said undoped polycrystalline layer and into said zone in the semiconductor body.

* * * * *